(12) United States Patent
Shin et al.

(10) Patent No.: US 12,075,684 B2
(45) Date of Patent: Aug. 27, 2024

(54) DISPLAY DEVICE

(71) Applicant: LG Display Co., Ltd., Seoul (KR)

(72) Inventors: Youngsub Shin, Paju-si (KR); DaeHeung Lee, Paju-si (KR); YoungHoon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/075,633

(22) Filed: Dec. 6, 2022

(65) Prior Publication Data

US 2023/0217701 A1  Jul. 6, 2023

(30) Foreign Application Priority Data

Dec. 31, 2021  (KR) .................. 10-2021-0194431

(51) Int. Cl.
| | |
|---|---|
| *H10K 59/80* | (2023.01) |
| *G06F 3/041* | (2006.01) |
| *H10K 59/122* | (2023.01) |
| *H10K 59/126* | (2023.01) |
| *H10K 59/38* | (2023.01) |
| *H10K 59/40* | (2023.01) |
| *G06F 3/044* | (2006.01) |

(52) U.S. Cl.
CPC ....... *H10K 59/8792* (2023.02); *G06F 3/0412* (2013.01); *H10K 59/122* (2023.02); *H10K 59/126* (2023.02); *H10K 59/38* (2023.02); *H10K 59/40* (2023.02); *H10K 59/873* (2023.02); *G06F 3/04164* (2019.05); *G06F 3/0446* (2019.05); *G06F 2203/04111* (2013.01)

(58) Field of Classification Search
CPC ............ H10K 59/00–95; H10K 59/40; H10K 50/865; H10K 50/844; H10K 59/122; H10K 50/8445; H10K 59/35; H10K 59/8792; H10K 59/873; G06F 3/0446; G06F 2203/04112; G06F 3/0412; G06F 3/0445; G06F 3/0443; G06F 3/044
See application file for complete search history.

(56) References Cited

U.S. PATENT DOCUMENTS

| | | |
|---|---|---|
| 10,168,844 B2 | 1/2019 | Kwon et al. |
| 10,310,650 B2 | 6/2019 | Heo et al. |
| 10,319,792 B2 | 6/2019 | Jo et al. |

(Continued)

FOREIGN PATENT DOCUMENTS

| | | |
|---|---|---|
| CN | 111063706 A | 4/2020 |
| CN | 113517414 A | 10/2021 |

(Continued)

*Primary Examiner* — Sanjiv D. Patel
(74) *Attorney, Agent, or Firm* — Birch, Stewart, Kolasch & Birch, LLP

(57) ABSTRACT

A display device including a substrate including a display area; a light-emitting element positioned on the substrate; a bank including a first opening corresponding to the light-emitting element; an encapsulation layer positioned on the light-emitting element; a touch electrode positioned on the encapsulation layer; a black matrix positioned on the touch electrode and including a first layer and a second layer positioned on the first layer, the second layer having a lower refractive index than the first layer; and a color filter positioned on the touch electrode.

18 Claims, 11 Drawing Sheets

(56) References Cited

U.S. PATENT DOCUMENTS

| | | | |
|---|---|---|---|
| 2016/0378224 A1* | 12/2016 | Kwon | H10K 59/8731 |
| | | | 345/174 |
| 2018/0095570 A1* | 4/2018 | Hong | G06F 3/0412 |
| 2018/0181240 A1 | 6/2018 | Heo et al. | |
| 2018/0182817 A1 | 6/2018 | Jo et al. | |
| 2020/0241705 A1 | 7/2020 | Kim et al. | |
| 2020/0257162 A1* | 8/2020 | Lee | H10K 59/122 |
| 2021/0005845 A1 | 1/2021 | Kim et al. | |
| 2021/0026473 A1 | 1/2021 | Kim et al. | |
| 2022/0037622 A1 | 2/2022 | Cai | |

FOREIGN PATENT DOCUMENTS

| | | | |
|---|---|---|---|
| JP | 2011-186437 A | | 9/2011 |
| JP | 2017-16655 A | | 1/2017 |
| JP | 2017-173492 A | | 9/2017 |
| JP | 2018-106698 A | | 7/2018 |
| JP | 2018-109963 A | | 7/2018 |
| JP | 2019-66613 A | | 4/2019 |
| KR | 10-2021-0081603 A | | 7/2021 |
| KR | 20210081603 A | * | 7/2021 |
| TW | 201441676 A | | 11/2014 |
| WO | WO 2014/136738 A1 | | 9/2014 |
| WO | WO 2015/159370 A1 | | 10/2015 |
| WO | WO 2019/026858 A1 | | 2/2019 |

\* cited by examiner

DISPLAY DEVICE

CROSS REFERENCE TO RELATED APPLICATION

This application claims priority to Korean Patent Application No. 10-2021-0194431, filed in the Republic of Korea on Dec. 31, 2021, the entire contents of which are hereby incorporated by reference into the present application.

BACKGROUND OF THE INVENTION

1. Field of the Invention

Embodiments of the present disclosure relate to a display device.

2. Description of the Prior Art

A display device is required to have low reflectance of external light so a user can easily identify information displayed on the display device. In particular, a display device includes a plurality of pixels including light-emitting elements and various circuit elements for driving the light-emitting elements. However, when external light is reflected by various material layers constituting the light-emitting and circuit elements, the user has difficulty viewing information displayed on the display device.

Accordingly, related art display devices use a polarization plate to lower the reflectance of external light. However, the polarization plate is made with an expensive material that increases the manufacturing costs of the display device, and increases the overall thickness of the display device. In addition, when light emitted from a light-emitting element passes through the polarization plate, the brightness decreases.

SUMMARY OF THE INVENTION

Accordingly, one aspect of the present invention is to address the above noted and other problems with the related art.

Another aspect of the present invention is to provide a display device without using an polarization plate or additional optical layers and that prevents a rainbow mura phenomenon from occurring due to light reflected from a display device.

In still another aspect, the present disclosure provides a display device including a black matrix having a first layer and a second layer positioned on the first layer and having a lower refractive index than the first layer, thereby having low reflectance and preventing a rainbow mura phenomenon.

To achieve these and other aspects, an embodiment of the present disclosure provides a display device including a substrate having a display area, a light-emitting element positioned on the substrate, a bank including a first opening corresponding to the light-emitting element, an encapsulation layer positioned on the light-emitting element, a touch electrode positioned on the encapsulation layer, a black matrix positioned on the touch electrode, and a color filter positioned on the touch electrode. The black matrix also includes a first layer and a second layer. The second layer is positioned on the first layer and may have a lower refractive index than the first layer.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EMBODIMENTS

Figure 1:
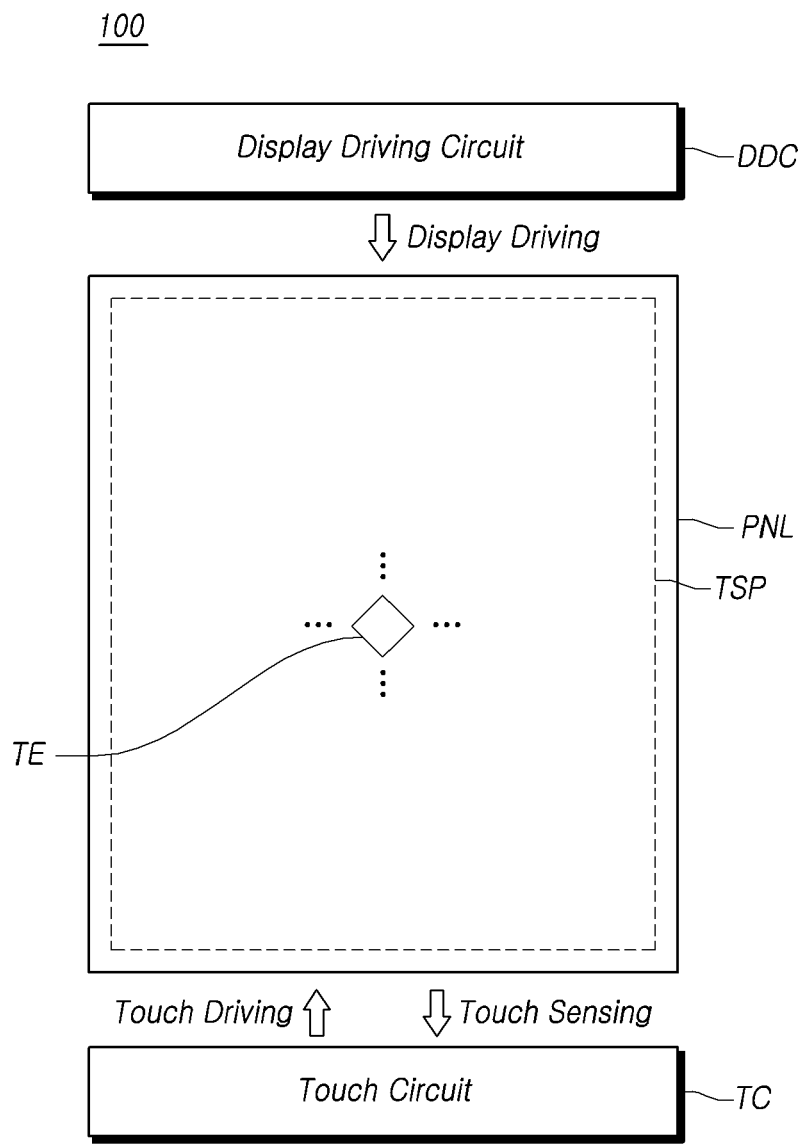
FIG. 1 is a system configuration diagram of a display device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings. Referring to FIG. 1, a display device 100 according to embodiments can provide an image displaying function of displaying an image and a touch sensing function of sensing a touch of a user.

To display an image, the display device 100 according to embodiments includes a display panel PNL in which data lines and gate lines are disposed, a display driving circuit DDC for driving the display panel PNL, and the like. In terms of a function, the display driving circuit DDC includes a data driving circuit for driving the data lines, a gate driving circuit for driving the gate lines, a controller for controlling the data driving circuit and the gate driving circuit, and the like.

The display driving circuit DDC can be implemented with one or more integrated circuits (ICs). For touch sensing, the display device 100 can include a touch panel TSP including a plurality of touch electrodes TE disposed as a touch sensor and a plurality of touch lines TL electrically connected to all or some of the plurality of touch electrodes TE are disposed, a touch circuit TC which drives the touch panel TSP to detect the presence or absence of a touch or a touch position, and the like.

In addition, the touch circuit TC supplies a touch driving signal to the touch panel TSP to drive the touch panel TSP, detects a touch sensing signal from the touch panel TSP, and detects the presence or absence of a touch and/or a touch position (touch coordinates) based on the detected touch sensing signal. Such a touch circuit TC can include a touch driving circuit which supplies a touch driving signal and receives a touch sensing signal, a touch controller which calculates the presence or absence of a touch and/or a touch position (touch coordinates), and the like. Here, the touch driving signal can be a direct current (DC) signal having a certain voltage value or an alternating current (AC) signal having a certain amplitude, swinging between a high level and a low level, and including a plurality of pulses.

Further, the touch circuit TC can be implemented with one or more components (for example, ICs) and be implemented separately from the display driving circuit DDC. In addition, the entirety or a portion of the touch circuit TC can be integrated with the display driving circuit DDC or an internal circuit thereof. For example, the touch driving circuit of the touch circuit TC can be implemented as an IC together with the data driving circuit of the display driving circuit DDC.

Further, the display device 100 can detect a touch based on capacitance formed in the touch electrodes TE. The display device 100 can also detect a touch through a capacitance-based touch sensing method such as a mutual-capacitance-based touch sensing method or a self-capacitance-based touch sensing method.

For the mutual-capacitance-based touch sensing method, the plurality of touch electrodes TE can be divided into driving touch electrodes (also referred to as driving electrodes, transmitting electrodes, or driving lines) to which a touch driving signal is applied, and sensing touch electrodes (also referred to as sensing electrodes, receiving electrodes, or sensing lines) at which a touch sensing signal is detected and which form capacitance together with the driving electrodes.

Among the driving touch electrodes in the touch electrodes TE, driving touch electrodes disposed in the same row (or the same column) are electrically connected to each other to form one driving touch electrode line. Also, among the sensing touch electrodes in the touch electrodes TE, sensing touch electrodes disposed in the same column (or the same row) are electrically connected to each other to form one sensing touch electrode line.

For the mutual-capacitance-based touch sensing method, the presence or absence of a touch and/or touch coordinates are detected based on a change in capacitance (mutual-capacitance) between the driving touch electrode (driving touch electrode line) and the sensing touch electrode (sensing touch electrode line) according to the presence or absence of a pointer such as a finger or a pen.

For the self-capacitance-based touch sensing method, each touch electrode TE serves as both a driving touch electrode (applying a touch driving signal) and a sensing touch electrode (detecting a touch sensing signal). That is, a touch driving signal is applied to each touch electrode TE, and a touch sensing signal is received through the touch electrode TE to which the touch driving signal is applied. Accordingly, in the self-capacitance-based touch sensing method, there is no distinction between the driving electrode and the sensing electrode. For the self-capacitance-based touch sensing method, the presence or absence of a touch and/or touch coordinates are detected based on a change in capacitance between the touch electrode TE and a pointer such as a finger or a pen.

As described above, the display device 100 according to embodiments can detect a touch through the mutual-capacitance-based touch sensing method or the self-capacitance-based touch sensing method. However, hereinafter, for convenience of description, an improved structure or the like for improving touch sensitivity will be described based on a display device 100 and a touch panel TSP to which a mutual-capacitance-based touch sensing method is adopted, but the improved structure or the like for improving the touch sensitivity can be equally applied to a display device 100 and a touch panel TSP in which a self-capacitance-based touch sensing method is adopted.

In addition, the display panel PNL of the display device 100 can be one of various types such as an organic light-emitting diode panel (OLED panel) and a liquid crystal display panel (LCD panel). Hereinafter, for convenience of description, an example of the OLED panel will be mainly described.

Figure 2:
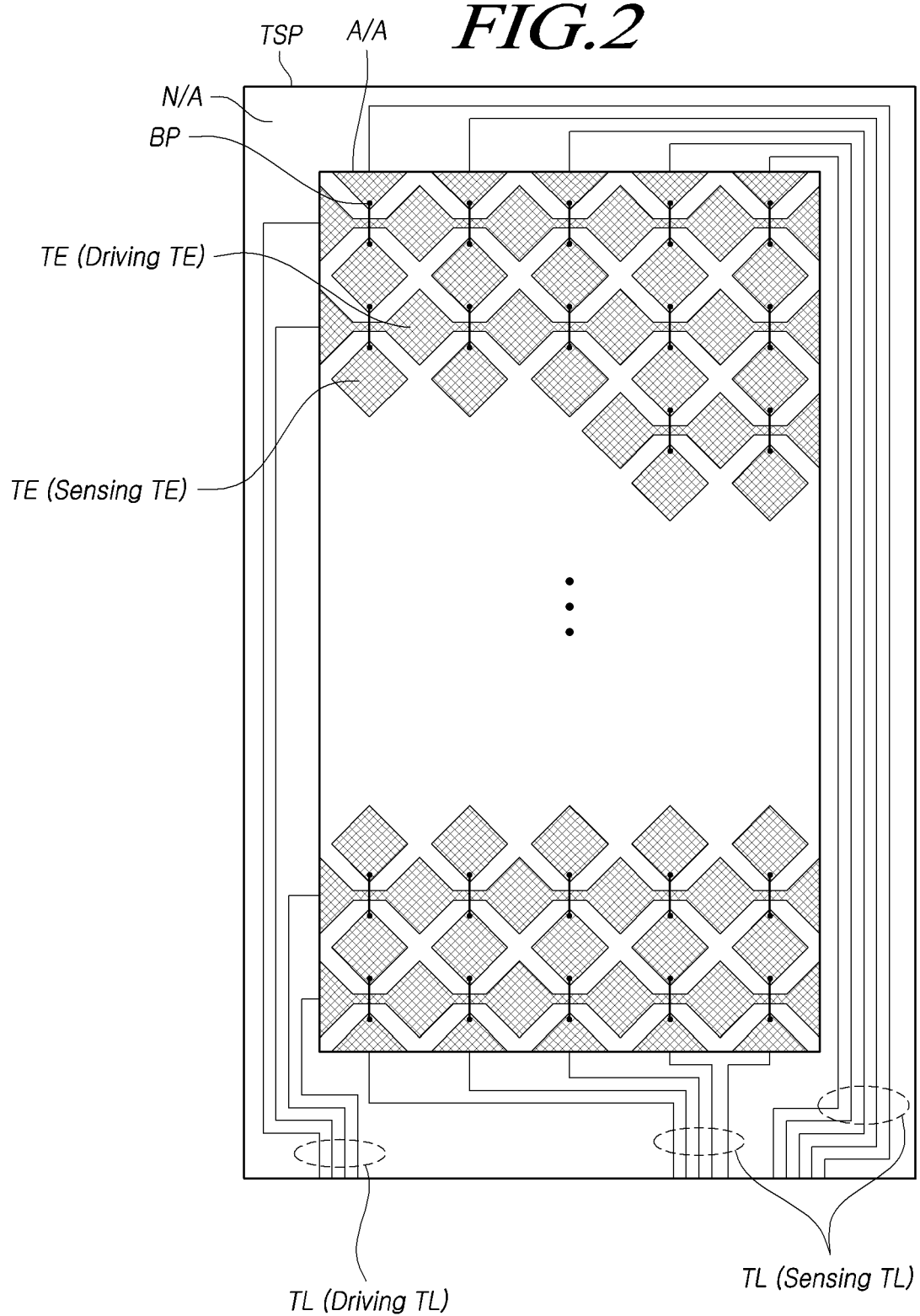
FIG. 2 is a view illustrating a touch panel according to embodiments of the present disclosure.
Figure 3:
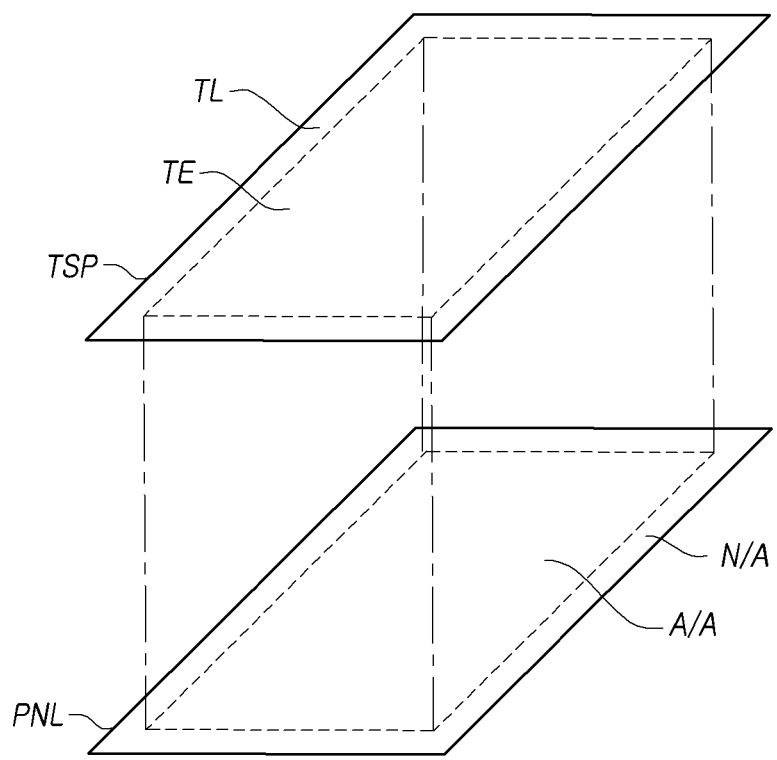
FIG. 3 is a view illustrating an area relationship between the display panel and a touch panel according to embodiments.

Next, FIG. 2 is a view illustrating a touch panel TSP, and FIG. 3 is a view illustrating an area relationship between a display panel PNL and the touch panel TSP according to embodiments. In addition, the touch panel TSP shown in FIG. 2 is a touch panel TSP for mutual-capacitance-based touch sensing.

Referring to FIG. 2, the touch panel TSP includes plurality of touch electrodes TE, and touch lines TL for electrically connecting the touch electrodes TE and a touch circuit TC. The touch lines TL are electrically connected to touch electrodes TE disposed at an outermost portion among the touch electrodes TE. Hereinafter, the touch electrodes TE disposed at the outermost portion will also be referred to as outermost touch electrodes O-TE.

In addition, to electrically connect the touch lines TL and the touch circuit TC, touch pads with which the touch circuit TC is in contact are provided in the touch panel TSP. The touch electrodes TE and the touch lines TL can be provided on the same layer or on different layers.

Further, when the mutual-capacitance-based touch sensing method is adopted for the display device 100, two or more touch electrodes TE disposed in the same row (or the same column) are electrically connected to form one driving touch electrode line (driving TE line). Two or more touch electrodes TE disposed in the same column (or the same row) can also be electrically connected to form one sensing touch electrode line (sensing TE line).

Two or more touch electrodes forming one driving TE line can be electrically connected, and the two or more touch electrodes can be integrated and electrically connected or be electrically connected through a bridge. Two or more touch electrodes TE forming one sensing TE line can also be electrically connected, and the two or more touch electrodes can be integrated and electrically connected or can be electrically connected through a bridge.

In the example of FIG. 2, the two or more touch electrodes forming one driving TE line are integrated and electrically connected, and the two or more touch electrodes TE forming one sensing TE line are electrically connected through a bridge BP. Here, the two or more touch electrodes forming one driving TE line are referred to as driving touch electrodes (driving TEs), and the two or more touch electrodes TE forming one sensing TE line are referred to as sensing touch electrodes (sensing TE).

In addition, at least one touch line TL can be connected to each driving touch electrode line, and at least one touch line TL can be connected to each sensing touch electrode line. Further, at least one touch line TL connected to each driving touch electrode line is referred to as a driving touch line (driving TL), and at least one touch line TL connected to each sensing touch electrode line is referred to as a sensing touch line (sensing TL). One touch pad TP can also be connected to one touch line TL.

Referring to FIG. 2, each touch electrode TE may have, for example, a contour having a rhombic shape, a contour having a rectangular shape (including a square shape) in some instances, and also have a contour having one of various shapes. The shape of the touch electrode TE can be variously designed in consideration of the display performance and the touch performance of the display device 100.

Although the touch panel TSP illustrated in FIG. 2 is shown as being long in a column direction, the touch panel TSP can be designed to be long in a row direction according to a type (for example, a television (TV), a monitor, or a mobile terminal) or a design of the display device 100. The touch panel TSP according to embodiments can also be provided outside the display panel PNL (external type) or be provided inside the display panel PNL (built-in type).

When the touch panel TSP is the external type, the touch panel TSP and the display panel PNL can be separately manufactured through different panel manufacturing processes and then bonded to each other. Also, when the touch panel TSP is the built-in type, the touch panel TSP and the display panel PNL can be manufactured together through one panel manufacturing process.

When the touch panel TSP is the built-in type, the touch panel TSP can be regarded as an assembly of the plurality of touch electrodes TE. Here, a plate on which the plurality of touch electrodes TE are placed can be a dedicated substrate or a layer (for example, an encapsulation layer) already present in the display panel PNL.

Referring to FIGS. 2 and 3, the display panel PNL includes an active area A/A in which an image is displayed and a non-active area N/A that is an area outside the active area A/A. Here, the active area A/A is also referred to as a display area, and the non-active area N/A is also referred to as a non-display area.

A plurality of subpixels defined by data lines and gate lines are also arranged in the active area A/A, and lines and pads for connecting the data lines, the gate lines, and various signal lines in the active area A/A to a display driving circuit DDC can be present in the non-active area A/A. The plurality of touch electrodes TE and the plurality of touch lines TL are also disposed in the touch panel TSP.

In addition, the plurality of touch electrodes TE can be positioned to correspond to the active area A/A of the display panel PNL. Further, the plurality of touch lines TL can be positioned to correspond to the active area A/A of the display panel PNL. That is, the plurality of touch lines TL can be provided outside a touch electrode area (active area A/A or corresponding area) in which the plurality of touch electrodes TE are disposed. The touch panel TSP can also be internal or external to the display panel PNL.

As described above, the touch electrodes TE are disposed in the active area A/A of the display panel PNL, and the touch lines TL are disposed in the non-active area N/A of the display panel PNL, thereby providing touch sensing that matches a screen display state.

Referring to FIG. 2, each touch line TL is electrically connected to the touch circuit TC. Among the plurality of touch lines TL, one end of each driving TL is electrically connected to a driving channel of the touch circuit TC, and the other end thereof is electrically connected to an outermost touch electrode disposed at an outermost portion among the touch electrodes TE included in a corresponding driving TE Line.

Among the plurality of touch lines TL, one end of each sensing TL is electrically connected to a driving channel of the touch circuit TC, and the other end thereof is electrically connected to an outermost touch electrode disposed at an outermost portion among the touch electrodes TE included in a corresponding sensing TE Line.

As shown in FIG. 2, the plurality of touch lines TL may have different lengths. That is, at least one of the plurality of touch lines TL can have a different length. Accordingly, respective touch lines TL may have different signal transmission characteristics or electrical characteristics.

Figure 4:
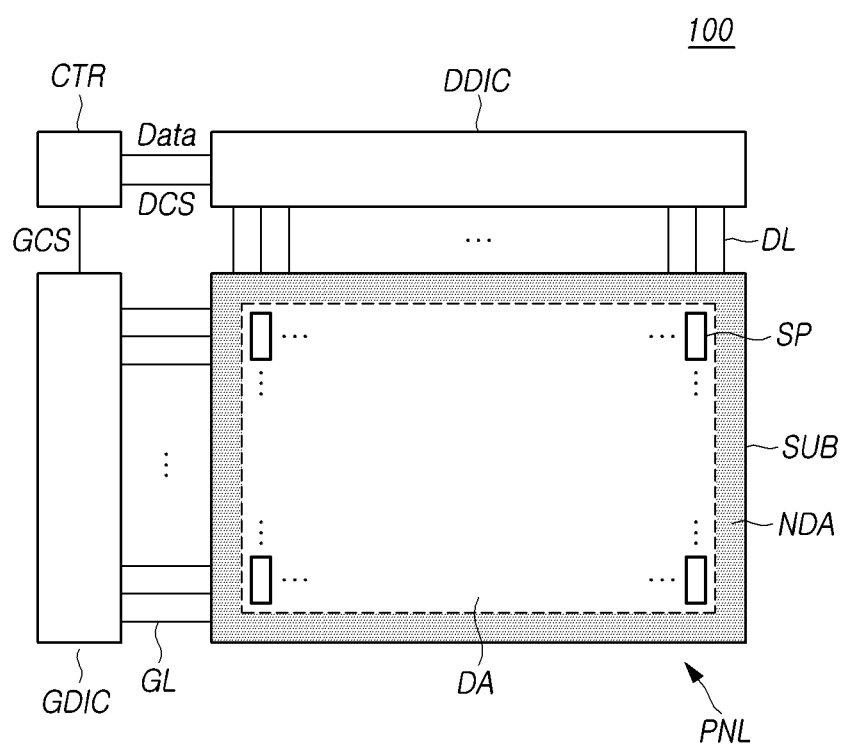
FIG. 4 is a system configuration diagram of a display device according to embodiments of the present disclosure.

Next, FIG. 4 is a system configuration diagram of a display device 100 according to embodiments of the present disclosure. Referring to FIG. 4, the display device 100 includes a display panel PNL and a driving circuit for driving the display panel PNL.

In FIG. 4, the driving circuit includes a data driving circuit DDIC, a gate driving circuit GDIC and a controller CTR for controlling the data driving circuit DDIC and the gate driving circuit GDIC. The display panel PNL also includes a substrate SUB and signal lines such as data lines DL and gate lines GL disposed on the substrate SUB. The display panel PNL also includes subpixels SP connected to the data lines DL and the gate lines GL.

In addition, the display panel PNL includes a display area DA where an image is displayed and a non-display area NDA where an image is not displayed. Also, the subpixels SP for displaying an image are disposed in the display area DA. In the non-display area NDA, the driving circuits DDIC, GDIC, and CTR are electrically connected or mounted, and a pad portion to which an IC or a printed circuit is connected is also disposed.

Further, the data driving circuit DDIC is for driving the data lines DL and supplying data voltages to the data lines DL. The gate driving circuit GDIC is for driving the gate lines GL and supplying gate signals to the gate lines GL. In addition, the controller CTR supplies a data control signal DCS to the data driving circuit DDIC to control an operation timing of the data driving circuit DDIC. The controller CTR can also supply a gate control signal GCS to the gate driving circuit GDIC to control an operation timing of the gate driving circuit GDIC.

In addition, the controller CTR can start a scan signal according to a timing set implemented in each frame. The controller CTR can also convert input image data input from an external device to be suitable for a data signal format used by the data driving circuit DDIC, output the converted image data to the data driving circuit DDIC, and control data driving at an appropriate time according to the scan.

To control the gate driving circuit GDIC, the controller CTR can output various gate control signals GCSs including gate start pulse (GSP), gate shift clock (GSC), and gate output enable (GOE) signals. To control the data driving circuit DDIC, the controller CTR can output various data control signals DCSs including source start pulse (SSP), source sampling clock (SSC), and source output enable (SOE) signals.

In addition, the controller CTR can be implemented as a separate component from the data driving circuit DDIC or can be integrated with the data driving circuit DDIC and implemented as an IC. Also, the data driving circuit DDIC receives image data from the controller CTR and supplies data voltages to the data lines DL to drive the data lines DL. Here, the data driving circuit DDIC is also referred to as a source driving circuit.

The data driving circuit DDIC can also include one or more source driver integrated circuits (SDICs). For example, each SDIC can be connected to the display panel PNL in a tape automated bonding (TAB) type, can be connected to a bonding pad of the display panel PNL in a chip-on-glass (COG) or chip-on-panel (COP) type, or can be implemented as a chip-on-film (COF) type and connected to the display panel PNL.

Further, the gate driving circuit GDIC can output a gate signal having a turn-on level voltage or a gate signal having a turn-off level voltage under the control of the controller CTR. The gate driving circuit GDIC can thus sequentially drive the gate lines GL by sequentially supplying a gate signal having a turn-on level voltage to the gate lines GL.

In addition, the gate driving circuit GDIC can be connected to the display panel PNL in a TAB type, can be connected to a bonding pad of the display panel PNL in a COG or COP type, or can be connected to the display panel PNL in a COF type. Alternatively, the gate driving circuit GDIC can be formed in the non-display area NDA of the display panel PNL in a gate-in-panel (GIP) type. The gate driving circuit GDIC can also be disposed on or connected to the substrate SUB. That is, when the gate driving circuit GDIC is the GIP type, the gate driving circuit GDIC can be disposed in the non-display area NDA of the substrate SUB. When the gate driving circuit GDIC is the COG type, the COF type, or the like, the gate driving circuit GDIC can be connected to the substrate SUB.

Further, at least one driving circuit of the data driving circuit DDIC and the gate driving circuit GDIC can be disposed in the display area DA. For example, at least one driving circuit of at least one of the data driving circuit DDIC and the gate driving circuit GDIC can be disposed not to overlap the subpixels SP or can be disposed so a portion or the entirety thereof overlaps the subpixels SP.

When a specific gate line GL is opened by the gate driving circuit GDIC, the data driving circuit DDIC can convert the image data received from the controller CTR into an analog data voltage and supply the analog data voltage to the data lines DL. The data driving circuit DDIC can also be connected to one side (for example, an upper or lower side) of the display panel PNL. However, according to a driving method, a panel design method, or the like, the data driving circuit DDIC can be connected to two sides (for example, the upper and lower sides) of the display panel PNL or can be connected to at least two side surfaces of four side surfaces of the display panel PNL.

Also, the gate driving circuit GDIC can be connected to one side (for example, a left side or a right side) of the display panel PNL. However, according to a driving method, a panel design method, or the like, the gate driving circuit GDIC can be connected to two sides (for example, the left and right sides) of the display panel PNL or can be connected to at least two side surfaces of the four side surfaces of the display panel PNL.

In addition, the controller CTR can be a timing controller used in a display technology, a control device which may include the timing controller to further perform other control functions, a control device different from the timing controller, or a circuit inside a control device. The controller CTR can also be implemented with various circuits or electronic components such as an IC, a field programmable gate array (FPGA), an application specific integrated circuit (ASIC), and a processor.

Further, the controller CTR can be mounted on a printed circuit board, a flexible printed circuit, or the like and be electrically connected to the data driving circuit DDIC and the gate driving circuit GDIC through the printed circuit board or the flexible printed circuit. The display device 100 according to the present embodiments can be a display including a backlight unit such as a liquid crystal display or can be a self-luminous display such as an OLED display, a quantum dot display, or a micro light-emitting diode (micro LED) display.

When the display device 100 is the OLED display, each subpixel SP includes an OLED, which emits light by itself, as a light-emitting element. When the display device 100 is the quantum dot display, each subpixel SP includes a light-emitting element made of quantum dots which are a semiconductor crystal that emits light by itself. When the display device 100 is the micro LED display, each subpixel SP includes a micro LED, which emits light by itself and is made of an inorganic material, as a light-emitting element.

Figure 5:
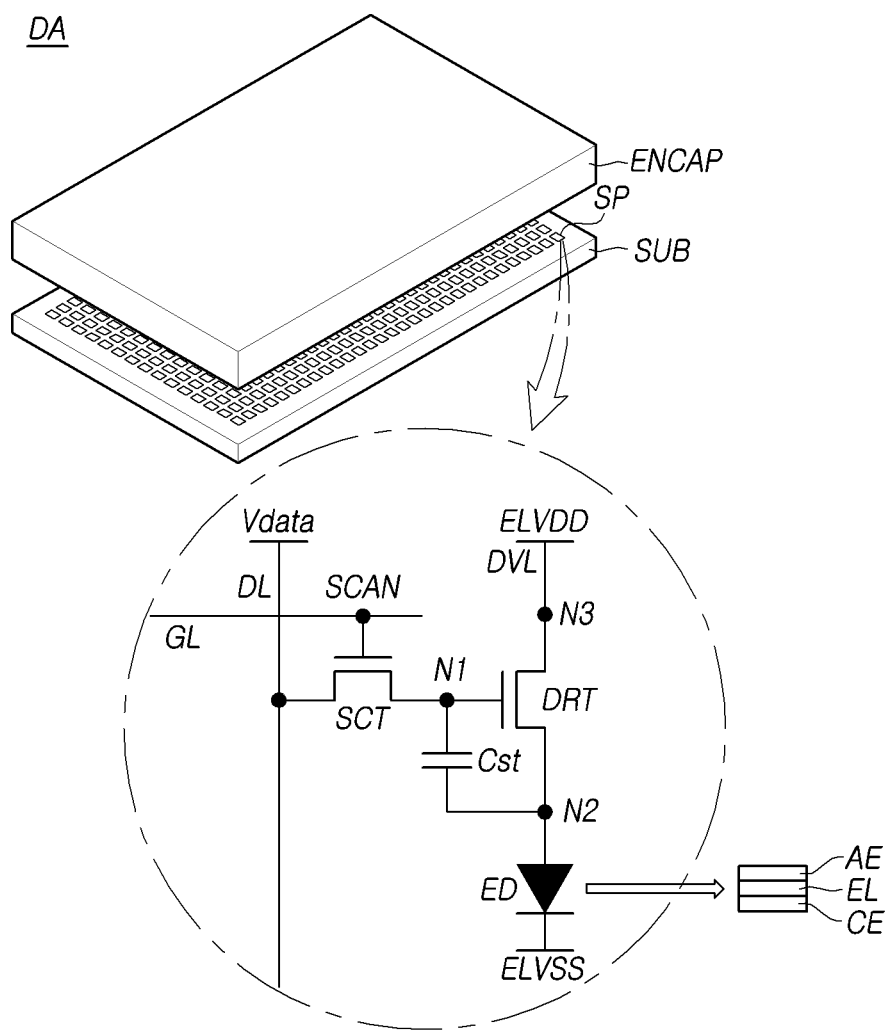
FIG. 5 shows a configuration diagram of a display area and a circuit diagram of a subpixel of a display device according to embodiments of the present disclosure.

Next, FIG. 5 is an equivalent circuit of a subpixel SP in a display panel PNL according to embodiments of the present disclosure. As shown, each subpixel SP disposed in a general area NA, a first optical area OA1, and a second optical area OA2 included in the display area DA can include a light-emitting element ED, a driving transistor DRT for driving the light-emitting element ED, a scan transistor SCT for transmitting a data voltage Vdata to a first node N1 of the driving transistor DRT, a storage capacitor Cst for maintaining a constant voltage during one frame, and the like.

Further, the driving transistor DRT includes the first node N1 to which the data voltage is applied, a second node N2 electrically connected to the light-emitting element ED, and a third node N3 to which a driving voltage ELVDD is applied from a driving voltage line DVL. In the driving transistor DRT, the first node N1 can be a gate node, the second node N2 can be a source node or a drain node, and the third node N3 can be a source node or a drain node.

The light-emitting element ED also includes an anode AE, a light-emitting layer EL, and a cathode CE. The anode AE is a pixel electrode disposed in each subpixel SP and is electrically connected to the second node N2 of the driving transistor DRT of each subpixel SP. The cathode CE is a common electrode commonly disposed in a plurality of subpixels SP, and a ground voltage ELVSS is applied thereto.

For example, the anode AE can be a pixel electrode, and the cathode CE can be a common electrode. Conversely, the anode AE can be the common electrode, and the cathode CE can be the pixel electrode. Hereinafter, for convenience of description, it is assumed that the anode AE is the pixel electrode and the cathode CE is the common electrode.

For example, the light-emitting element ED can be an OLED, an inorganic light-emitting diode, or a quantum dot light-emitting element. When the light-emitting element ED is the OLED, the light-emitting layer EL in the light-emitting element ED includes an organic light-emitting layer including an organic material.

Further, the scan transistor SCT is controlled to be turned on/off by a scan signal SCAN that is a gate signal applied through a gate line GL. As shown in FIG. 5, the scan transistor SCT is electrically connected between the first node N1 of the driving transistor DRT and a data line DL. The storage capacitor Cst is also electrically connected between the first node N1 and the second node N2 of the driving transistor DRT.

Each subpixel SP can have a 2T (transistor)-1C (capacitor) structure including two transistors DRT and SCT and one capacitor Cst as shown in FIG. 5. In some instances, each subpixel SP can further include one or more transistors or further include one or more capacitors.

In addition, the storage capacitor Cst is not a parasitic capacitor (for example, Cgs or Cgd) which is an internal capacitor that can be provided between the first node N1 and the second node N2 of the driving transistor DRT, and can be an external capacitor which is intentionally designed outside the driving transistor DRT.

Each of the driving transistor DRT and the scan transistor SCT can also be an n-type transistor or a p-type transistor. Because circuit elements (in particular, the light-emitting element ED) in each subpixel SP are vulnerable to external moisture or oxygen, an encapsulation layer ENCAP can be disposed in the display panel PNL to prevent external moisture or oxygen from penetrating into the circuit elements (in particular, the light-emitting element ED). The encapsulation layer ENCAP can be formed to cover the light-emitting element ED.

Figure 6:
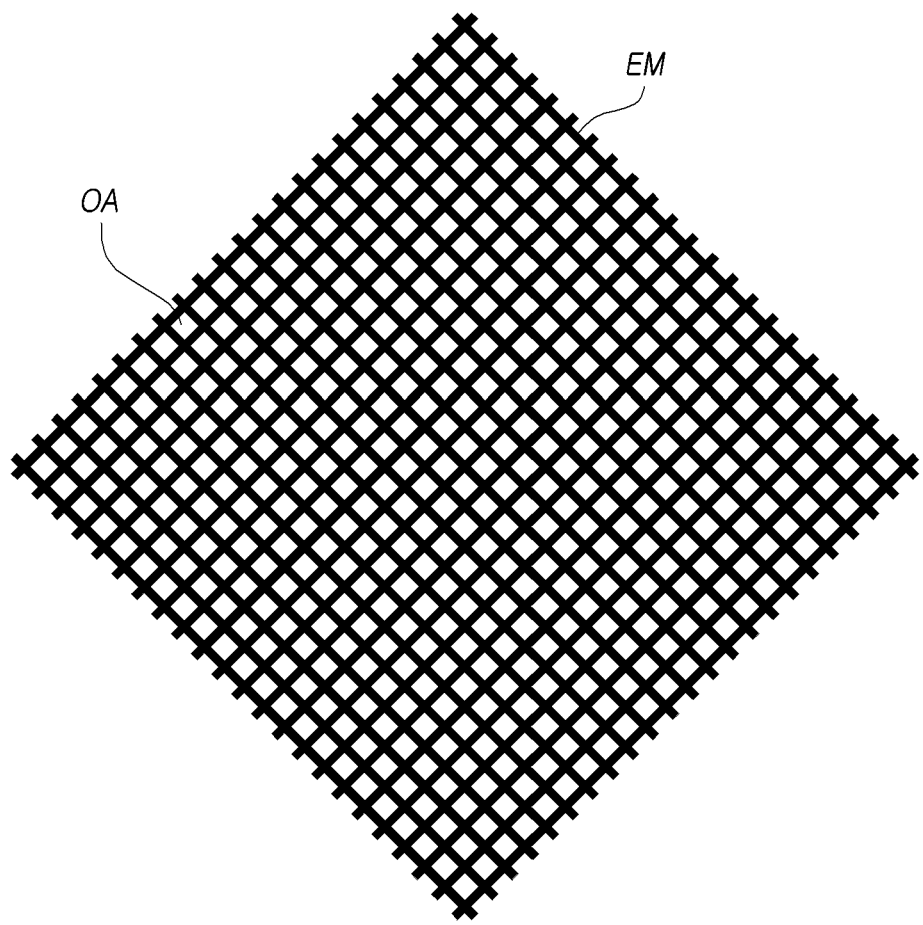
FIG. 6 is a view illustrating a mesh type touch electrode in a display device according to embodiments of the present disclosure.

Next, FIG. 6 is a view illustrating a mesh type touch electrode TE in a display device 100 according to embodiments. As shown, each touch electrode TE can be an electrode metal EM patterned in a mesh type to have holes OA. Here, the holes OA are also referred to as open areas. In the touch electrode TE formed by patterning the electrode metal EM in a mesh type (mesh type), each hole OA corresponds to an emission part of one or more subpixels.

Figure 7:
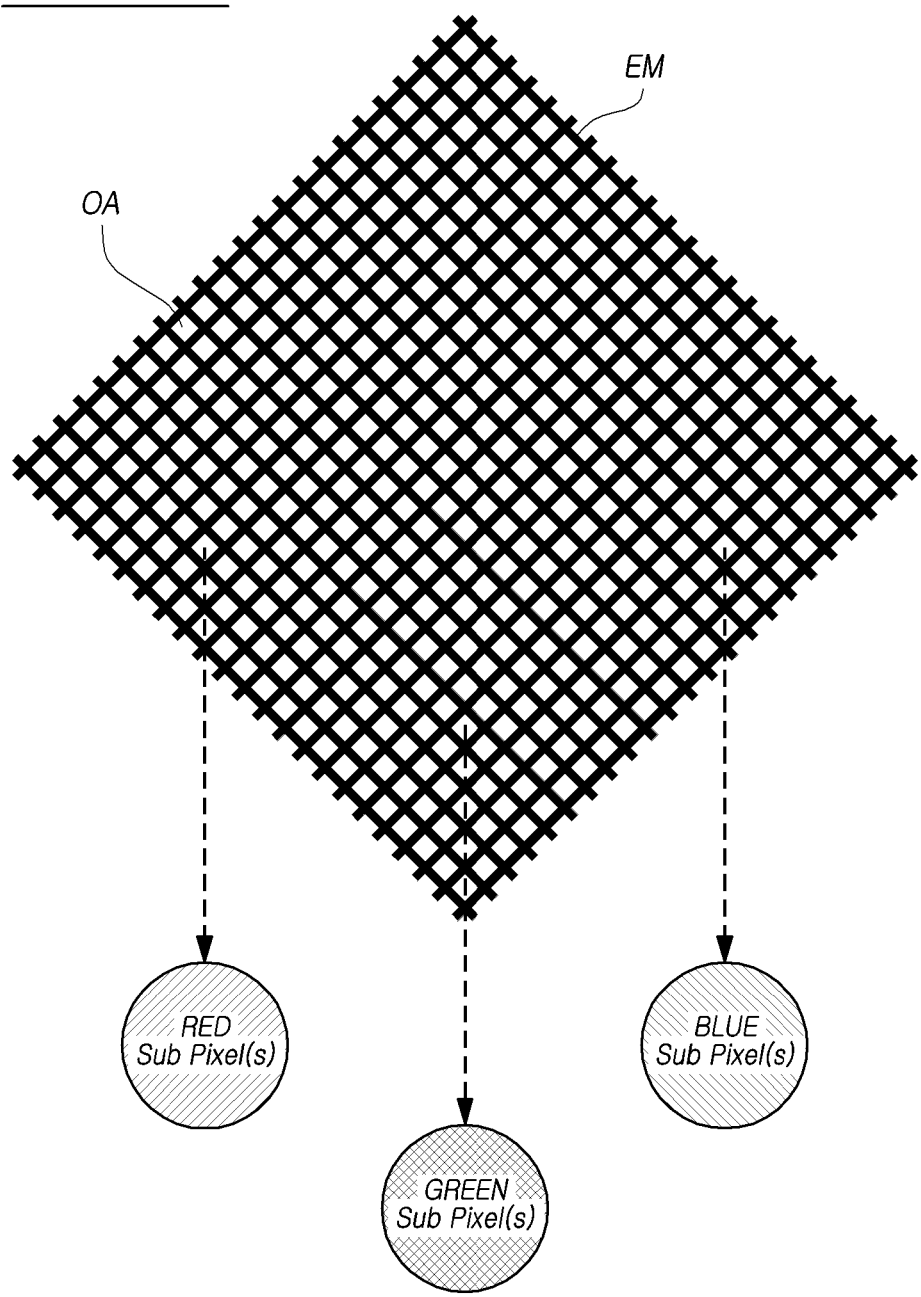
FIG. 7 is a view illustrating a correspondence relationship between an area of a mesh type touch electrode and an area of a subpixel in a display device according to embodiments of the present disclosure.

Next, FIG. 7 is a view illustrating a correspondence relationship between an area of a mesh type touch electrode TE and an area of a subpixel in a display device 100 according to embodiments. Referring to FIG. 7, each touch electrode TE can be an electrode metal EM that is patterned in a mesh type to have holes OA referred to as open areas.

In the touch electrode TE formed by patterning the electrode metal EM in a mesh type (mesh type), each hole OA also corresponds to an emission part of one or more subpixels. For example, when a display panel PNL is an LCD panel, the emission part of the subpixel can include a pixel electrode or a color filter. When the display panel PNL is an OLED panel, the emission part of the subpixel can include an anode, an organic light-emitting layer, and the like of an OLED and include a color filter or the like in some instances.

As described above, because the electrode metal EM of the touch electrode TE is patterned such that the emission part of one or more subpixels is provided to correspond to a position of each open area OA when viewed in a plan view, the luminous efficiency of the display panel PNL can be increased, even when the electrode metal EM is made of an opaque material.

Figure 8:
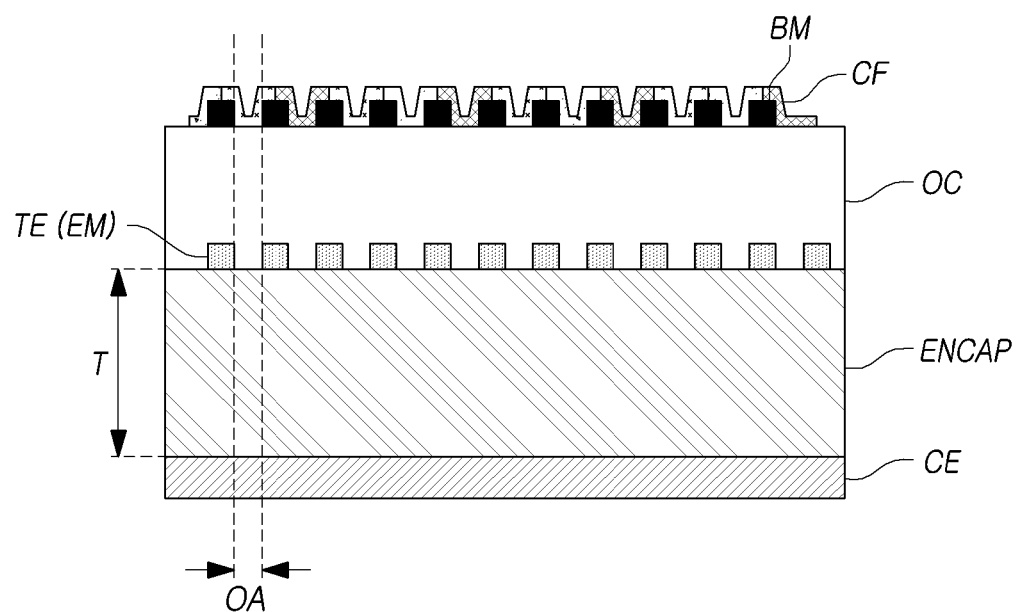
FIG. 8 is a view exemplarily illustrating positions of a color filter and a black matrix in a display device according to embodiments of the present disclosure.

Next, FIG. 8 is a view exemplarily illustrating positions of a color filter and a black matrix in a display device 100 according to embodiments. Referring to FIG. 8, a cathode CE of an OLED is provided under an encapsulation layer ENCAP. A thickness T of the encapsulation layer ENCAP may be, for example, 5 micrometers or more, thereby reducing parasitic capacitances formed between the cathode CE of the OLED and touch electrodes TE. Accordingly, it is possible to prevent a decrease in touch sensitivity due to the parasitic capacitance.

Also, in each touch electrode TE, an electrode metal EM can be patterned in a mesh type (network shape) having open areas OA, and when viewed in a vertical direction, one or more subpixels or an emission part thereof can be provided in the open areas OA. As described above, the electrode metal EM of the touch electrode TE is patterned so the emission part of one or more subpixels is provided to correspond to a position of each open area OA provided in an area of the touch electrode TE when viewed in a plan view, thereby increasing the aperture ratio and luminous efficiency of a display panel PNL. Accordingly, as shown in FIG. 8, a position of a black matrix BM corresponds to a position of the electrode metal EM of the touch electrode TE. In addition, positions of a plurality of color filters CF correspond to positions of the plurality of touch electrodes TE.

Because the color filters CF are positioned at positions corresponding to positions of the open areas OA, it is possible to provide an organic light-emitting display panel and the display device 100 having excellent light-emitting performance. A vertical positional relationship between the color filters CF and the touch electrodes TE will be described next.

As shown in FIG. 8, the color filters CF and the black matrix BM are positioned on the touch electrodes TE. That is, the color filters CF can be positioned on the encapsulation layer ENCAP and be positioned on touch sensor metals of the touch electrode TE, a touch line TL, and the like. The color filters CF and the black matrix BM can also be positioned on an overcoat layer OC on the plurality of touch electrodes TE.

Accordingly, in consideration of display performance such as light-emitting performance and touch performance, it is possible to provide the display device 100 in an OLED display type having an optimal positional relationship between the color filters CF and the touch electrodes TE.

In addition, attempts have also been made to embed the touch panel TSP including the touch electrodes TE in the display panel PNL to improve manufacturing convenience and reduce the size of the display device 100. However, there are considerable difficulties and many limitations in embedding the touch panel TSP in the display panel PNL which is an organic light-emitting display panel.

For example, during a manufacturing process of the organic light-emitting display panel PNL, there is a limitation in that a high-temperature process for forming the touch electrodes TE generally made of a metal material inside the panel is not free due to an organic material. Due to constraint factors such as structural characteristics and processes of such an organic light-emitting display panel, it is difficult to arrange the touch electrodes TE as a touch sensor inside the organic light-emitting display panel PNL. Accordingly, a touch structure has been implemented through a method in which the touch panel TSP is not embedded in the organic light-emitting display panel PNL but is attached onto the organic light-emitting display panel PNL.

However, as shown in FIG. 8, through a touch-on encapsulation layer (TOE) structure in which the touch electrodes TE are formed on the encapsulation layer ENCAP and a color-on encapsulation layer (COE) structure in which the color filters CF are formed on the encapsulation layer ENCAP, it is possible to provide the organic light-emitting display panel PNL embedded with the touch panel TSP, capable of having excellent display performance and touch performance.

Figure 9:
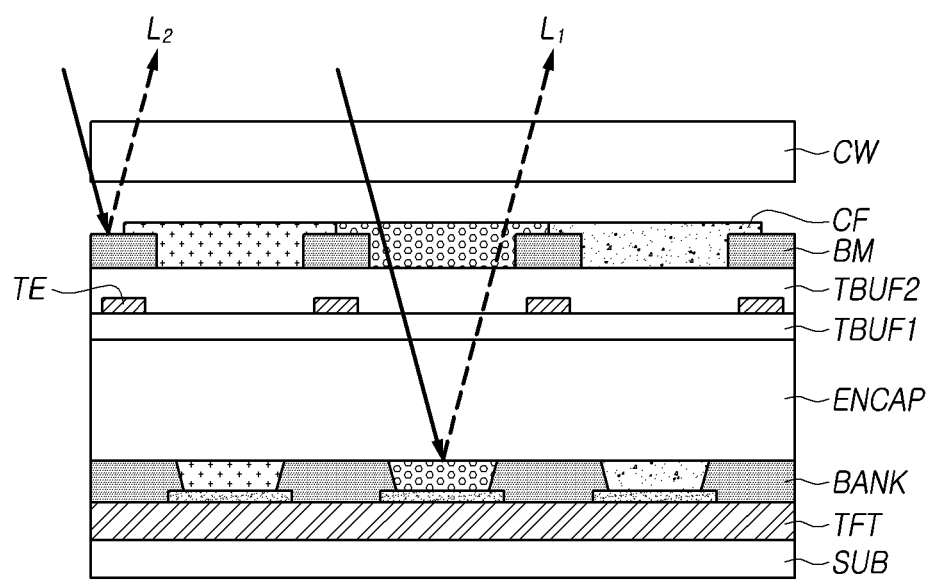
FIG. 9 is a cross-sectional view of a display device according to a comparative example of the present disclosure.

Next, FIG. 9 is a cross-sectional view of a display device according to a comparative example of the present disclosure. As shown, the display device includes a substrate SUB, a thin film transistor layer TFT, a bank BANK, an encapsulation layer ENCAP, a first touch buffer layer TBUF1, a touch electrode TE, a second touch buffer layer TBUF2, a black matrix BM, a color filter CF, and a cover window CW.

External light incident on the display device can be reflected by various parts of the display device. For example, L1 indicates external light reflected from an emission area of a light-emitting element, and L2 indicates external light reflected from the black matrix. Due to an arrangement of a color filter and a pixel in an emission area and an inclination of a pixel electrode of the light-emitting element, reflected light can cause a rainbow mura phenomenon, which degrades the display quality of the display device.

To solve such a phenomenon, a pigment can be added to an overcoat layer or an optical adhesive layer positioned between the color filter CF and the cover window CW, but additional costs occur and a structure becomes complicated. In addition, even if a pigment is added to the overcoat layer or the optical adhesive layer, there is still a limitation in making the display device have low reflectance.

Figure 10:
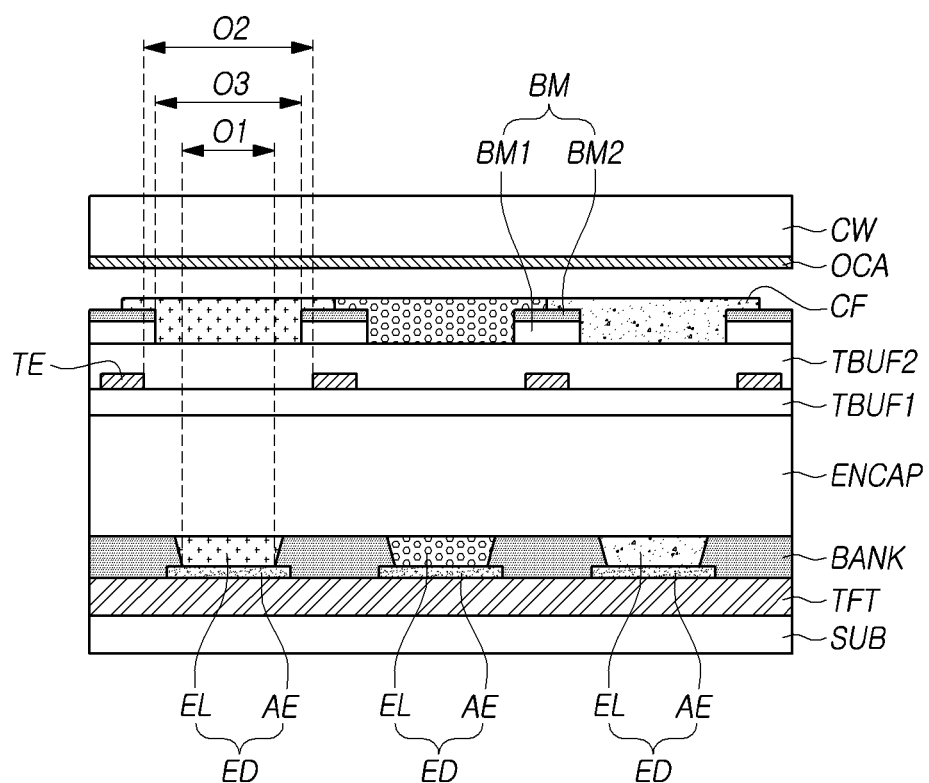
FIGS. 10 and 11 are cross-sectional views of a display device according to embodiments of the present disclosure.
Figure 11:
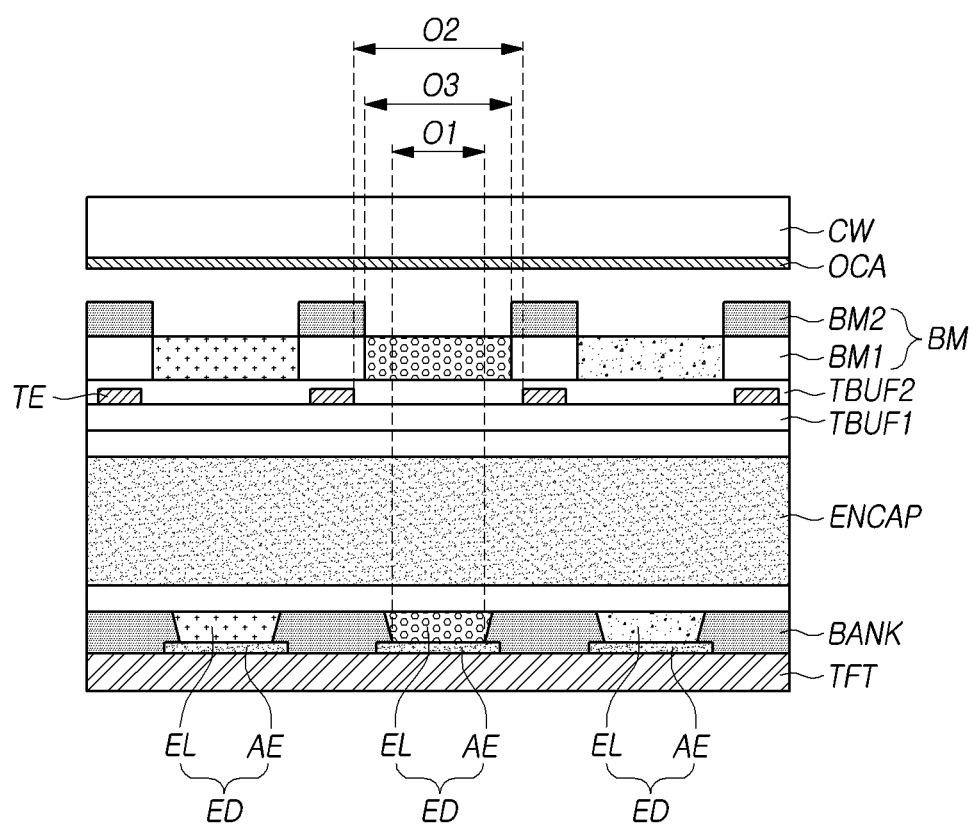

Next, FIGS. 10 and 11 are cross-sectional views of a display device according to embodiments of the present disclosure. Referring to FIGS. 10 and 11, the display device includes a substrate SUB, a light-emitting element ED, an encapsulation layer ENCAP, a bank BANK, a touch electrode TE, a black matrix BM, and a color filter CF. In addition, the display device includes a thin film transistor layer TFT positioned on the substrate SUB, a first touch buffer layer TBUF1 positioned on the encapsulation layer ENCAP, a second touch buffer layer TBUF2 positioned on the touch electrode TE, and an optical adhesive layer OCA positioned on the color filter CF.

As shown, the substrate SUB includes a display area, and a plurality of light-emitting elements ED are positioned or disposed in the display area. The thin film transistor layer TFT is also disposed on the substrate SUB and includes transistors driving the light-emitting element ED.

Further, the light-emitting elements ED are also electrically connected to the transistors positioned on the thin film transistor layer TFT. The bank BANK is positioned on the substrate SUB, and in particular can be positioned on an anode AE of the light-emitting element ED. An emission area of a subpixel is also defined by the bank BANK and corresponds to the opening area of the bank BANK in which the anode AE of the light-emitting element ED is exposed.

For example, as shown in FIG. 10, the bank BANK1 includes a first opening O1 corresponding to a light-emitting element ED so light generated in an emission area of the light-emitting element ED is emitted through the first opening O1. That is, the emission area can be defined by the first opening O1 of the bank BANK (i.e., an area of the first opening is substantially the same as the emission area).

In addition, the encapsulation layer ENCAP is disposed on the light-emitting element ED and protects the light-emitting element ED from external oxygen and moisture. Further, the touch electrode TE is positioned on the encapsulation layer ENCAP and includes a second opening O2. For example, the second opening O2 of the touch electrode TE can be the holes OA described above in FIGS. 6 and 7. As shown in FIG. 10, the first opening O1 of the bank BANK is formed within the second opening O2 of the touch electrode TE. That is, the touch electrode TE is positioned in a non-emission area rather than the emission area defined by the bank BANK.

In addition, the black matrix BM is positioned on the touch electrode TE to prevent external light from being reflected from the touch electrode TE and to prevent the display device from having high reflectance. As shown, the black matrix BM can include a first layer BM1 and a second layer BM2 positioned on the first layer BM1. In addition, a refractive index of the second layer BM2 is lower than that of the first layer BM1. When the first layer BM1 positioned at a lower side has a high refractive index and the second layer BM2 positioned at an upper side has a low refractive index, reflectance with respect to external light can be further lowered.

According to a related art, a single layer black matrix is used and a pigment is included in an optical adhesive layer OCA. When a display device, which includes a polarization plate instead of a color filter CF and a black matrix BM positioned on a touch buffer layer TBUF2, is assumed to have a reflectance of 4.7%, a reflectance of a display device, which does not include a polarization plate and has a single layer structure of a black matrix and a color filter, is reduced to 5.6%. However, due to an arrangement of a color filter and an inclination of an anode AE, there is a difference in a reflection direction between light with a wavelength in a green region and light with a wavelength in red and blue regions, which causes a rainbow mura phenomenon. Therefore, when low reflectance is implemented using a polarization plate, there is a problem in that power consumption increases by about 20% compared with a structure in which the polarization plate is omitted. When the polarization plate is omitted to reduce power consumption, there are problems in that a rainbow mura phenomenon occurs due to a color filter, which causes a problem in that the reflectance increases, and reflectance and power consumption have a trade-off relationship.

However, the display device according to embodiments of the present disclosure does not include a polarization plate to thus has low power consumption and also includes the first layer BM1 and the second layer BM2 to thus have low reflectance, thereby solving problems of the related art.

Table 1 below shows a comparison between characteristics of display devices according to an example and comparative examples of the present disclosure.

TABLE 1

| BM pattern portion Type | | Characteristics | |
|---|---|---|---|
| | | Reflectance (%) | Optical density |
| Example | Black matrix multilayer (first and second layers) | 4.2 | 2.0 |
| Comparative Example 1 | Black matrix single layer (addition of pigment to adhesive layer and overcoat layer) | 5.6 | 1.5 |
| Comparative Example 2 | Black matrix single layer (addition of pigment to adhesive layer) | 6.5 | 1.5 |

In Table 1, the example is the display device according to embodiments of the present disclosure having the structure shown in FIG. 10. Comparative Example 1 is a display device in which a pigment is added to an overcoat layer positioned on a color filter and an adhesive layer positioned on the overcoat layer in the comparative example shown in FIG. 9. Comparative Example 2 is a display device in which a pigment is added to an adhesive layer positioned on a color filter in the comparative example shown in FIG. 9.

Referring to Table 1, because the display device according to embodiments of the present disclosure has low reflectance as well as a high optical density, unlike the display device of the comparative example in which low reflectance and a high optical density are in a trade-off relationship, it can be seen that the display device according to embodiments of the present disclosure has both low reflectance and a high optical density.

In addition, the first layer BM1 and the second layer BM2 can be in direct contact with each other. That is, another layer is not positioned between the first layer BM1 and the second layer BM2. When the first layer BM1 and the second layer BM2 are in direct contact with each other, the black matrix BM can have low reflectance.

Further, the first layer BM1 and the second layer BM2 may include black nanoparticles. The types of black nanoparticles are not particularly limited and can be commonly used in the black matrix BM. In addition, a weight ratio of the black nanoparticles included in the first layer BM1 can be lower than a weight ratio of the black nanoparticles included in the second layer BM2. When the weight ratio of the black nanoparticles in the first layer BM1 is lower than the weight ratio of the black nanoparticles included in the second layer BM2, the black matrix BM may have low reflectance.

The first layer BM1 can also include the black nanoparticles, a binder, a photosensitizer, and an additive. The first layer BM1 can be formed through a low temperature process at a temperature of 100° C. or less. Also, the second layer BM2 may include the black nanoparticles, a binder, a photosensitizer, and an additive. The second layer BM2 can be formed through a low temperature process at a temperature of 100° C. or less.

An area in which the first layer BM1 is positioned can be substantially the same as an area in which the second layer BM2 is positioned. When the areas in which the first layer BM1 and the second layer BM2 are positioned are substantially the same, light emitted from the light-emitting element ED can be prevented from being internally reflected by the black matrix BM, because a third opening O3 of the black matrix BM can have a sufficient area while external light is prevented from being reflected from the touch electrode TE.

In addition, as shown, the black matrix BM includes the third opening O3 formed in the second opening O2 of the touch electrode TE, so the black matrix BM can effectively prevent external light incident on the display device from being reflected by the touch electrode TE.

The first opening O1 of the bank BANK is also formed in the third opening O3 of the black matrix BM, light emitted from the emission area can be prevented from being internally reflected by the black matrix BM, because the third opening O3 can be spaced a certain distance from the emission area.

In addition, the color filter CF is positioned on the touch electrode and can fill the third opening O3 of the black matrix BM. The color filter CF can include color filter patterns corresponding to colors of light emitted from the light-emitting element.

Referring to FIG. 10, a portion of the color filter CF can be positioned on the second layer BM2 of the black matrix BM. In such an example, it is possible to more effectively prevent external light from being reflected by the touch electrode TE, because the black matrix BM and the color filter CF overlap each other in an area in which the touch electrode TE is positioned. In addition, the optical adhesive layer OCA can be positioned on the color filter CF and may include, for example, a pigment to lower the reflectance.

Referring to FIG. 11, the sum of thicknesses of the first layer BM1 and the second layer BM2 can be greater than a thickness of the color filter CF. That is, unlike the example shown in FIG. 10, the color filter CF is positioned only in an opening of the black matrix BM and is not positioned on the black matrix BM. When the sum of the thicknesses of the first layer BM1 and the second layer BM2 is greater than that of the color filter CF, light reflected from the touch electrode TE can be more effectively reduced.

Thus, according to embodiments of the present disclosure, the display device 100 includes a substrate SUB including a display area, a light-emitting element ED positioned on the substrate SUB, a bank BANK, an encapsulation layer ENCAP positioned on the light-emitting element ED, a touch electrode TE positioned on the encapsulation layer ENCAP, a black matrix BM positioned on the touch electrode TE, and a color filter CF positioned on the touch electrode TE.

The bank BANK1 includes a first opening O1 corresponding to the light-emitting element ED, and the black matrix BM includes a first layer BM1 and a second layer BM2. Further, the second layer BM2 is positioned on the first layer BM1 and has a lower refractive index than the first layer BM1. For example, the first layer BM1 can have a refractive index in a range of 2.1-2.7 and the second layer BM2 can have a refractive index in a range of 1.4-1.8. Thus, the destructive interference between the first layer BM1 and the second layer BM2 can be controlled to reduce the reflectance by selecting the refractive indexes of the first and second layers BM1 and BM2 using the above ranges.

In addition the first layer BM1 and the second layer BM2 can be in direct contact with each other and include black nanoparticles. A weight ratio of the black nanoparticles included in the first layer BM1 can also be lower than a weight ratio of the black nanoparticles included in the second layer BM2. In addition, in one embodiment, the first layer BM1 can include $TiO_2$ (titanium oxide) such as Rutile, Anatase, etc.

Further, an area in which the first layer BM1 is positioned is substantially the same as an area in which the second layer BM2 is positioned. Also, the first layer BM1, the second layer BM2, and the touch electrode TE are positioned to overlap each other in a display area DA.

In addition, the touch electrode TE includes a second opening O2, and the first opening O1 of the bank is formed in the second opening O2 of the touch electrode TE. The black matrix BM also includes a third opening O3 positioned in the second opening O2 of the touch electrode TE. The black matrix BM also includes a third opening O3. In addition, the first opening O1 of the bank is formed in the third opening O3 of the black matrix BM. Also, a portion of the color filter CF is positioned on the second layer BM2, and the sum of thicknesses of the first layer BM1 and the second layer BM2 can be greater than a thickness of the color filter CF.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
   a substrate including a display area;
   a light-emitting element positioned on the substrate;
   a bank comprising a first opening corresponding to the light-emitting element;
   an encapsulation layer positioned on the light-emitting element;
   a touch electrode positioned on the encapsulation layer;
   a black matrix positioned on the touch electrode and including a first layer and a second layer, the first layer being disposed between the touch electrode and the second layer, and the second layer having a lower refractive index than the first layer; and
   a color filter positioned on the touch electrode,
   wherein the first layer includes a refractive index in a range of 2.1-2.7 and the second layer includes a refractive index in a range of 1.4-1.8.

2. The display device of claim 1, wherein the first layer directly contacts the second layer.

3. The display device of claim 1, wherein an area in which the first layer is positioned is substantially the same as an area in which the second layer is positioned.

4. The display device of claim 1, wherein the first layer, the second layer, and the touch electrode overlap each other in the display area.

5. The display device of claim 1, wherein:
   the touch electrode comprises a second opening; and
   the first opening of the bank is formed within the second opening of the touch electrode.

6. The display device of claim 5, wherein:
   the black matrix comprises a third opening; and
   the third opening of the black matrix is positioned within a second opening of the touch electrode.

7. The display device of claim 6, wherein:
   the first opening of the bank is formed within the third opening of the black matrix.

8. The display device of claim 6, wherein a portion of the color filter is disposed on the second layer, and
   wherein the color filter is filled in the third opening.

9. The display device of claim 1, wherein a sum of thicknesses of the first and second layers of the black matrix is greater than a thickness of the color filter.

10. A display device comprising:
    a plurality of light-emitting element disposed on a substrate;
    a bank comprising a plurality of first openings defining emission areas for the plurality of light-emitting elements;
    an encapsulation layer disposed on the bank and the light-emitting elements;
    a mesh type electrode pattern disposed on the encapsulating layer and including a plurality of touch electrode portions and a plurality of second openings respectively overlapping the plurality of first openings so the touch electrode portions are disposed in non-emission areas outside the emission areas defined by the bank;
    a touch buffer layer disposed on the mesh type electrode pattern;
    a black matrix pattern positioned on the touch buffer layer and including a plurality of black matrix portions and a plurality of third openings respectively overlapping the plurality of first openings so the black matrix portions are disposed in the non-emission areas, wherein each black matrix portion includes a first layer disposed on the touch buffer layer and a second layer disposed on the first layer, the first layer being disposed between one of the plurality of touch electrode portions and the second layer, and the second layer having a lower refractive index than the first layer; and
    a plurality of color filters disposed within the third openings of the black matrix pattern,
    wherein the first layer includes a refractive index in a range of 2.1-2.7 and the second layer includes a refractive index in a range of 1.4-1.8.

11. The display device of claim 10, wherein the first layer of the black matrix portions directly contacts the second layer of the black matrix portions.

12. The display device of claim 10, wherein an area in which the first layer of the black matrix portions is disposed is substantially the same as an area in which the second layer of the black matrix portions is disposed.

13. The display device of claim 10, wherein a width of a corresponding black matrix portion is greater than a width of a corresponding touch electrode portion.

14. The display device of claim 10, wherein the plurality of color filter disposed within the third openings of the black matrix extend onto a top surface of the first layer of an adjacent black matrix portion.

15. The display device of claim 10, wherein a width of a corresponding second opening is greater than a width of a corresponding third opening, and the width of the corresponding third opening is greater than a width of a corresponding first opening.

16. The display device of claim 10, further comprising:
another touch buffer layer disposed between the encapsulation layer and the mesh type electrode pattern.

17. The display device of claim 10, wherein a thickness of the first layer of the black matrix portions is greater than a thickness of the second layer of the black matrix portions.

18. The display device of claim 10, wherein a sum of thicknesses of the first and second layers of the black matrix portions is greater than a thickness of the color filters such that the black matrix portions protrude above a top surface of the color filters.

* * * * *